United States Patent
Kim et al.

(10) Patent No.: US 7,804,105 B2
(45) Date of Patent: Sep. 28, 2010

(54) SIDE VIEW TYPE LED PACKAGE

(75) Inventors: Nam Young Kim, Seoul (KR); Tae Kwang Kim, Seoul (KR); Kyoung Bo Han, Seoul (KR); Myung Hee Lee, Incheon (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 19 days.

(21) Appl. No.: 12/299,882

(22) PCT Filed: Jun. 27, 2007

(86) PCT No.: PCT/KR2007/003108

§ 371 (c)(1),
(2), (4) Date: Nov. 6, 2008

(87) PCT Pub. No.: WO2008/002068

PCT Pub. Date: Jan. 3, 2008

(65) Prior Publication Data
US 2009/0179219 A1    Jul. 16, 2009

(30) Foreign Application Priority Data
Jun. 27, 2006  (KR) .................. 10-2006-0057853
Jun. 27, 2006  (KR) .................. 10-2006-0057854

(51) Int. Cl.
*H01L 33/00* (2010.01)
(52) U.S. Cl. ................... 257/99; 257/E33.066
(58) Field of Classification Search ............ 257/99, 257/E23.066
See application file for complete search history.

(56) References Cited

U.S. PATENT DOCUMENTS

| | | | |
|---|---|---|---|
| 7,242,035 B2 * | 7/2007 | Kim et al. | 257/99 |
| 7,598,101 B2 * | 10/2009 | Park et al. | 438/26 |
| 2004/0135156 A1 | 7/2004 | Takenaka | |
| 2005/0141584 A1 | 6/2005 | Ohe et al. | |
| 2006/0170083 A1 | 8/2006 | Kim et al. | |
| 2007/0120234 A1 * | 5/2007 | Kim et al. | 257/666 |
| 2009/0050925 A1 * | 2/2009 | Kuramoto et al. | 257/100 |
| 2009/0267085 A1 * | 10/2009 | Lee et al. | 257/88 |

FOREIGN PATENT DOCUMENTS

| | | |
|---|---|---|
| JP | 2002-223004 | 8/2002 |
| KR | 10-2006-0010578 | 2/2006 |

* cited by examiner

*Primary Examiner*—Trung Dang
(74) *Attorney, Agent, or Firm*—H.C. Park & Associates, PLC

(57) ABSTRACT

In a side view type light emitting diode (LED) package, a lead frame portion and lead frame electrical contact portions are exposed outside a package body to serve as an additional heat dissipation path. The side view type LED package includes an LED chip, a package body having a side surface with an opening for receiving the LED chip, and lead frames for applying a current to the LED chip. The lead frames include inner leads electrically connected to the LED chip within the package body; electrical contact lower legs extending from the inner leads to a lower portion of the package body and exposed outside the package body in the vicinity of a lower surface of the package body perpendicular to the side surface; and a heat dissipation means extending, separately from the electrical contact lower legs, from at least one of the inner leads outside the package body.

12 Claims, 3 Drawing Sheets

[Fig. 1]
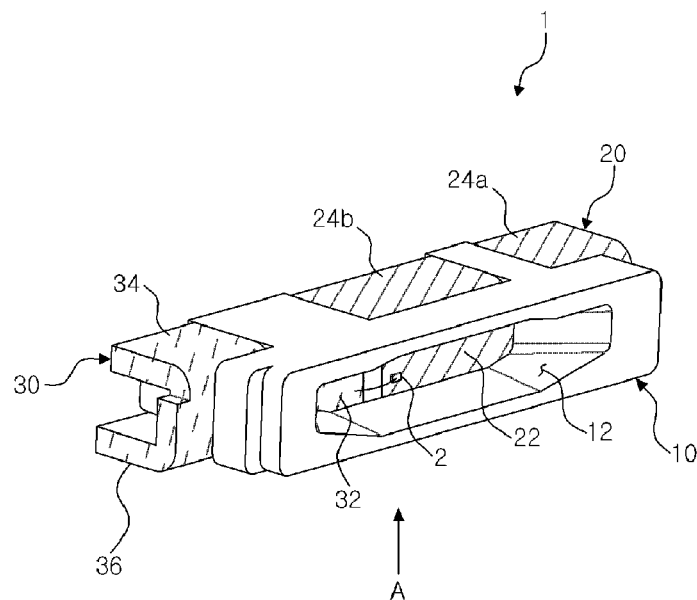
[Fig. 2]
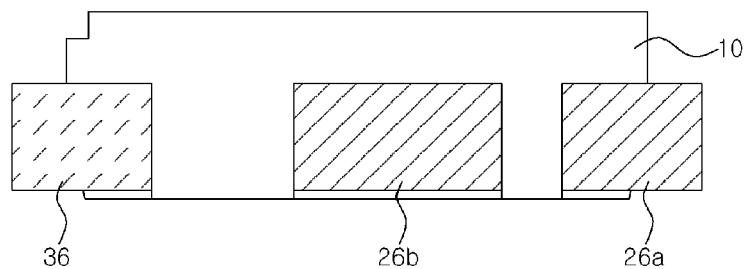
[Fig. 3]
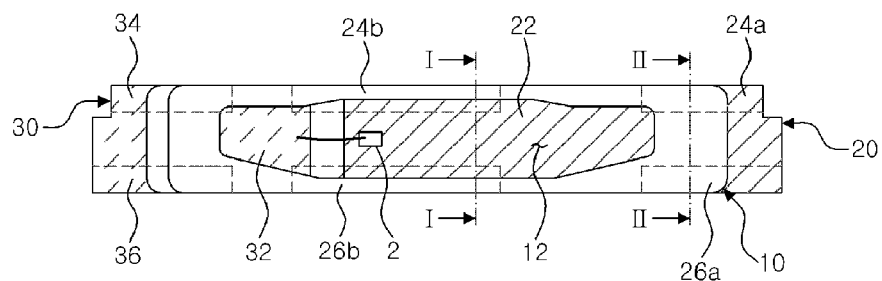
[Fig. 4]
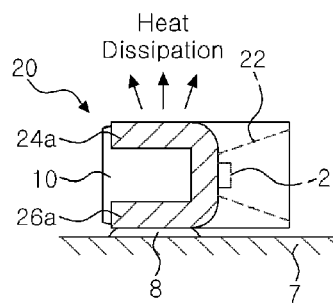

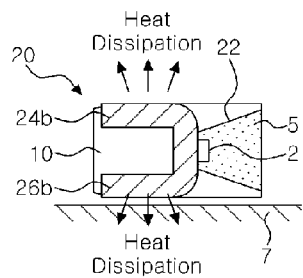
[Fig. 5]
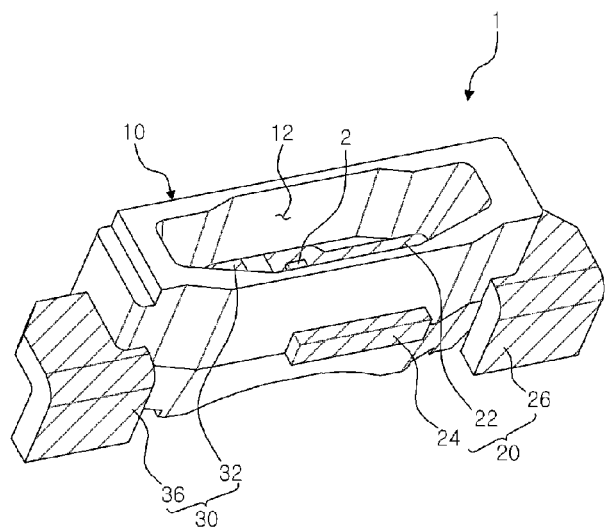
[Fig. 6]
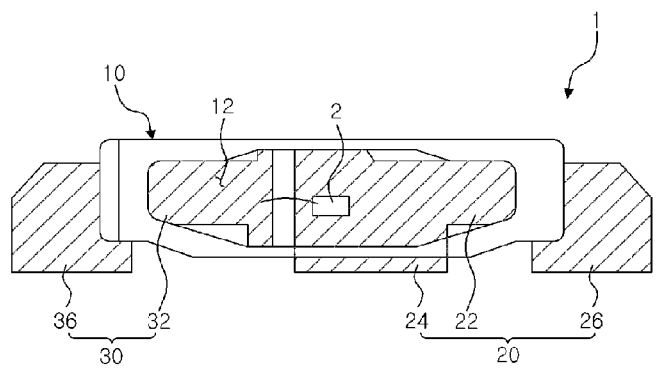
[Fig. 7]
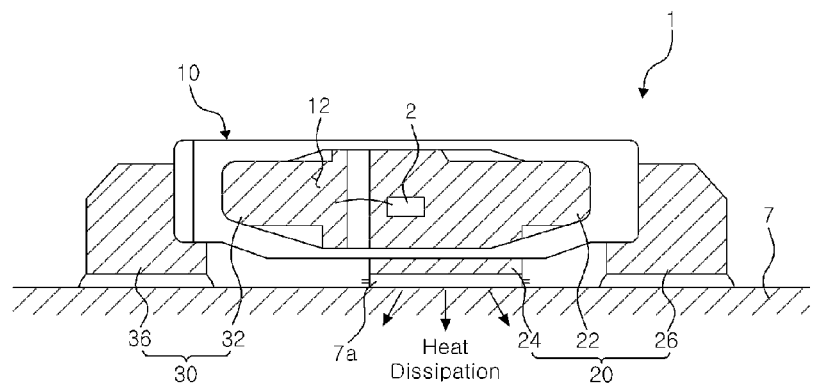
[Fig. 8]

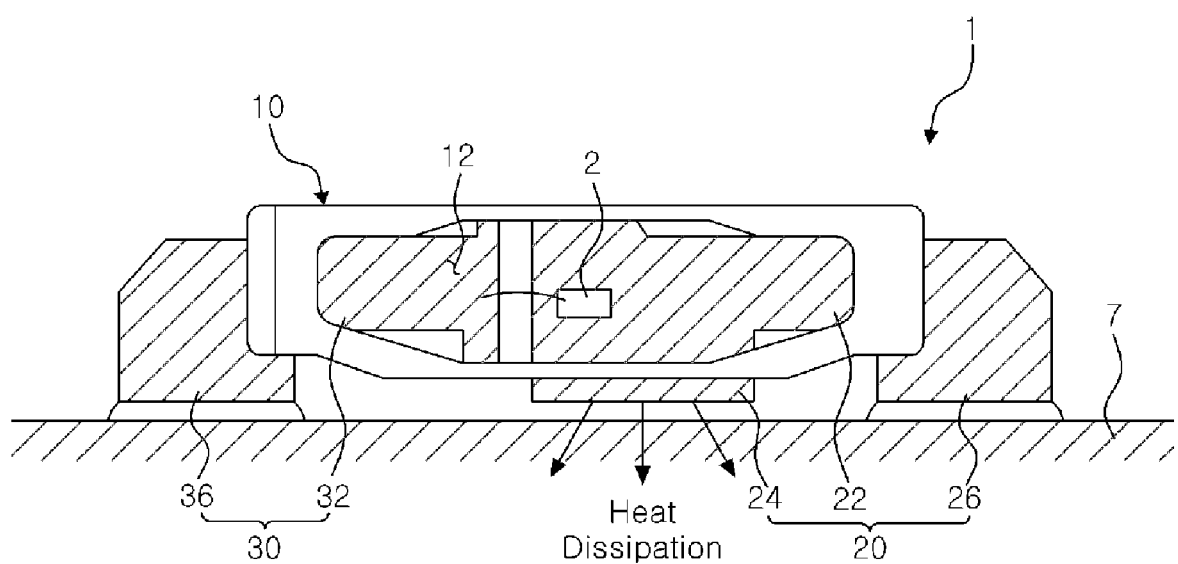
[Fig. 9]

SIDE VIEW TYPE LED PACKAGE

CROSS REFERENCE TO RELATED APPLICATIONS

This application is the National Stage of International Application No. PCT/KR2007/003108, filed Jun. 27, 2007, and claims priority from and the benefit of Korean Patent Application No. 10-2006-0057853, filed on Jun. 27, 2006, and Korean Patent Application No. 10-2006-0057854, filed on Jun. 27, 2006, which are all hereby incorporated by reference for all purposes as if fully set forth herein.

BACKGROUND OF THE INVENTION

1. Field of the Invention

The present invention relates to a side view type LED package, and more particularly, to a side view type LED package with an improved heat dissipation property.

2. Discussion of the Background

Generally, a light source system using a light emitting diode chip (hereinafter, referred to as "LED chip") has been used by being mounted on various kinds of package structures depending on their intended uses. Among such package structures, a side view type LED package is configured to emit light in a side direction. For example, in small electronic equipment such as a mobile phone, the side view type LED package has been widely used as backlight illumination for a display while the side view type LED package is positioned at a side of a light guide plate to provide light parallel to the light guide plate.

A conventional side view type LED package includes a package body that is made of a resin or ceramic material and has a side surface formed with an opening, wherein a mounting region for an LED chip is provided at the opening formed in the side surface of the package body so that light is emitted in a side direction from the LED chip positioned at the opening of the side surface. The side view type LED package further includes lead frames that are electrically connected to the LED chip in the opening, and the lead frames extend toward a lower portion of the package body to form electrical contacts by means of, e.g., soldering.

However, the conventional side view type LED package has a problem in that since heat dissipation paths are limited only to outer leads which are portions of the lead frames for forming electrical contact surfaces, it is difficult to significantly dissipate heat generated from the LED chip. This makes it difficult to apply a current equal to or larger than a rated current to the side view type LED package. For example, the conventional side view type LED package has used a current (e.g., 20 mA) lower than its rated current (e.g., 30 mA) due to its poor heat dissipation property. This becomes a main cause of limitation on a luminous intensity of the side view type LED package. Furthermore, contrary to a conventional top view type LED package with an LED chip mounted on a top surface thereof, the side view type LED package is difficult to install a heat sink for improving a heat dissipation property, so that the side view type LED package has been used only for limited usage with a current less than its rated current.

SUMMARY OF THE INVENTION

Accordingly, an object of the present invention is to provide a side view type LED package, wherein a portion of a lead frame in addition to electrical contact portions of the lead frame is exposed outside a package body, thereby allowing the exposed portion to serve as an additional heat dissipation path.

Another object of the present invention is to provide a side view type LED package, wherein a portion of a lead frame in addition to electrical contact portions of the lead frame is exposed outside a package body such that the exposed portion is positioned at an upper portion of the package body which is in significant contact with external air.

A further object of the present invention is to provide a side view type LED package, wherein a portion of a lead frame in addition to electrical contact portions of the lead frame is exposed outside a package body but the exposed portion is shielded by the package body.

A side view type light emitting diode (LED) package according to an aspect of the present invention includes an LED chip, a package body having a side surface formed with an opening for receiving the LED chip, and lead frames for applying a current to the LED chip, wherein the lead frames comprise inner leads electrically connected to the LED chip within the package body; electrical contact lower legs extending from the inner leads to a lower portion of the package body so as to be exposed outside the package body in the vicinity of a lower surface of the package body perpendicular to the side surface; and a heat dissipation means extending, separately from the electrical contact lower legs, from at least one of the inner leads outside the package body.

According to an embodiment of the present invention, the heat dissipation means may comprise at least one upper leg extending toward an upper portion of the package body so as to define a heat dissipation path in the vicinity of an upper surface of the package body. The at least one upper leg may comprise a plurality of upper legs, and at least one of the upper legs is formed integrally with one of the inner leads that is connected directly to the LED chip. The lower legs and the at least one upper leg may be bent to have horizontal surfaces at the upper and lower surfaces of the package body, respectively.

The electrical contact lower legs may be a pair of electrical contact lower legs positioned at both ends of the package body while forming electrical contacts of different polarities, and the heat dissipation means may have a heat dissipation lower leg positioned between the pair of electrical contact lower legs.

The upper legs and the lower legs including the electrical contact lower legs may be formed to be symmetrical with each other at the upper and lower portions of the package body. The upper and lower legs may be positioned on the same planes as the upper and lower surfaces of the package body, respectively.

According to another embodiment of the present invention, the heat dissipation means may comprise a heat dissipation protrusion extending from one of the inner leads connected directly to the LED chip so as to protrude outside the lower surface of the package body. The heat dissipation protrusion may be positioned between the electrical contact lower legs, and the electrical contact lower legs may have distal ends formed with electrical contact surfaces to be soldered to a substrate, and the heat dissipation protrusion may be spaced apart from the substrate. Alternatively, the heat dissipation protrusion may be in contact with an external heat dissipation element provided on the substrate.

In addition, the lead frames may be formed by cutting and bending a metal plate so that the inner leads, the electrical contact lower legs and the heat dissipation means have an identical thickness.

According to the present invention, in a side view type LED package with a structure in which it is difficult to install a heat sink, a portion of a lead frame is used as a heat dissipation means to solve a problem of increases in the junction temperature and thence thermal resistance of an LED chip. Therefore, it is possible to implement a side view type LED package that can use a current capable of more improving luminance.

Further, according to the embodiment of the present invention, it is possible to implement a side view type LED package with a compact size and simple structure even though the heat dissipation means for solving the problem of increases in the junction temperature and thence thermal resistance of the LED chip is included therein.

BRIEF DESCRIPTION OF THE DRAWINGS

FIG. 1 is a perspective view showing a side view type LED package according to a first embodiment of the present invention.

FIG. 2 is a bottom view of the side view type LED package when viewed in a direction designated by "A" in FIG. 1.

FIG. 3 is a front view of the side view type LED package shown in FIGS. 1 and 2.

FIG. 4 is a sectional view taken along line I-I of FIG. 3, illustrating the operation of the side view type LED package according to the first embodiment of the present invention.

FIG. 5 is a sectional view taken along line II-II of FIG. 3, illustrating the operation of the side view type LED package according to the first embodiment of the present invention.

FIG. 6 is a perspective view showing a side view type LED package according to a second embodiment of the present invention.

FIG. 7 is a front view showing the side view type LED package according to the second embodiment of the present invention.

FIG. 8 is a view showing a state where the side view type LED package according to the second embodiment of the present invention is mounted on a substrate, wherein a heat dissipation protrusion is in contact with a heat dissipation element on the substrate.

FIG. 9 is a view showing a state where the side view type LED package according to the second embodiment of the present invention is mounted on a substrate, wherein a heat dissipation protrusion is spaced apart from the substrate.

DETAILED DESCRIPTION OF THE ILLUSTRATED EMBODIMENTS

Hereinafter, preferred embodiments of the present invention will be described in detail with reference to the accompanying drawings. The preferred embodiments set forth below are provided merely for illustrative purposes so as to sufficiently transfer the spirit of the present invention to those skilled in the art, and thus, can be implemented in different forms.

FIGS. 1 to 5 show a side view type LED package according to a first embodiment of the present invention. As shown in the figures, the side view type LED package 1 according to the first embodiment of the present invention includes a package body 10, and a pair of lead frames 20 and 30 (hereinafter, referred to as "first and second lead frames") spaced apart from each other. The first and second lead frames 20 and 30 are hatched to distinguish them from the package body 10. The first and second lead frames 20 and 30 are differently hatched to draw a distinction between the first and second lead frames 20 and 30 that are separated from each other.

The package body 10 includes an opening 12 defining a mounting region for an LED chip 2. The opening 12 is formed at a position where light emitted from the LED chip 2 is caused to travel in a side direction, i.e., in a side surface of the package body 10. The package body 10 supports the pair of lead frames, i.e., the first and second lead frames 20 and 30. At this time, it is preferred that the package body 10 be molded out of a resin such that the package body 10 has the opening in the side surface thereof and supports the first and second lead frames 20 and 30.

The lead frames 20 and 30 include first and second inner leads 22 and 32, respectively, which are positioned within the opening 12 of the package body 10. At this time, the LED chip 2 is connected directly to the first inner lead 22 while the second inner lead 32 is electrically connected to the LED chip 2 by means of wire bonding. Further, the lead frames 20 and 30 include upper legs 24a, 24b and 34 extending from the first and second inner leads 22 and 32 while penetrating through an upper portion of the package body 10, and lower legs 26a, 26b and 36 (well shown in FIG. 2) extending from the first and second inner leads 22 and 32 while penetrating through a lower portion of the package body 10.

The upper legs 24a, 24b and 34 and the lower legs 26a, 26b and 36 are perpendicularly bent at the upper and the bottom portions of the package body 10 and thus have horizontal surfaces. More preferably, the respective legs are bent to be positioned on the same planes as upper and lower surfaces of the package body 10. All the legs are represented by dotted lines in FIG. 3.

Among the lower legs, the first and third lower legs 26a and 36 are positioned at both ends of the package body 10 and electrically connected to a printed circuit board (PCB) or flexible printed circuit board (FPCB) by means of soldering, so that the first and third lower legs 26a and 36 can serve as not only electrical contact lower legs defining electrical contacts of different polarities but also outer leads. Further, the second lower leg 26b of the lower legs is positioned between and spaced apart from the first and third lower legs 26a and 36 so as to form another heat dissipation path for use in outwardly dissipating heat generated from the LED chip 2.

The side view type LED package 1 according to the present invention has an additional heat dissipation path at the upper portion of the package body 10, wherein the heat dissipation path is defined by the upper legs 24a, 24b and 34. Specifically, the first and second upper legs 24a and 24b are formed integrally with the lead frame 20 that is connected directly to the LED chip 2, thereby greatly contributing to outward dissipation of a large amount of heat generated from the LED chip 2 when a high current is applied to the LED chip 2. Furthermore, the upper legs 24a, 24b and 34 are perpendicularly bent at the upper portion of the package body 10 so as to contribute to an increase in a heat dissipation area without increasing the overall size of the side view type LED package 1. At this time, the first and third lower legs 26a and 36 as the electrical contact lower legs, the second lower leg 26b as the heat dissipation lower leg, and the upper legs 24a, 24b and 34 defining additional heat dissipation paths separately from the second lower leg 26b are formed by cutting and bending a metal plate with a certain thickness and have the same thickness.

Referring to FIGS. 4 and 5, the side view type LED package 1 will be described in more detail below.

At a first position shown in FIG. 4, the lead frame 20 is configured to have a simple "U"-like sectional structure of which upper and lower portions are provided with the first upper leg 24a and the first lower leg 26a, respectively, and is supported by the package body 10. At this time, the first lower leg 26a is connected to a PCB or FPCB 7 by means of soldering to form an electrical contact 8. Specifically, the entire area of an upper portion of the first upper leg 24a integrally connected to the first lower leg 26a is outwardly exposed so that the heat generated from the LED chip 2 can be dissipated outwardly through the exposed entire area of the upper portion.

Referring to FIG. 5, at a second position, the lead frame 20 is configured to have a simple "U"-like sectional structure of which upper and lower portions are provided with the second upper leg 24b and the second lower leg 26b, respectively. At this time, the entire area of an upper portion of the second upper leg 24b is externally exposed so that the heat generated from the LED chip 2 can be dissipated outwardly through the exposed entire area of the upper portion. Further, the second lower leg 26b integrally connected to the second upper leg 24b is slightly spaced apart from the PCB or FPCB 7 while being in contact with external air, thereby defining another heat dissipation path. The LED chip 2 on the first lead frame 20 is encapsulated by an encapsulating material 5 such as epoxy resin within the opening 12 of the package body 10.

In the side view type LED package 1 according to the present embodiment shown in FIGS. 1 to 5, the lead frames 20 and 30 have the upper legs 24a, 24b and 34 and the lower legs 26a, 26b and 36 which are configured to be symmetrical with each other in a vertical direction and of which the numbers are the same. Further, the respective legs of the lead frames 20 and 30 are bent to be positioned on the same planes as the upper and lower surfaces of the package body 10, so that the side view type LED package 1 can have a compact size and structure without an increase in the overall size thereof. Specifically, the side view type LED package 1 according to the present embodiment not only has the compact size and structure as describe above but also can secure sufficient heat dissipation paths by using the aforementioned legs, particularly, the first and second upper legs 24a and 24b and/or the second lower leg 26b of the lead frame 20 connected directly to the LED chip 2. Securing sufficient heat dissipation paths can suppress an increase in the junction temperature of the LED chip 2 due to application of a high current and can also greatly reduce the thermal resistance of the side view type LED package 1 which increases as the junction temperature increases.

Hereinafter, a second embodiment of the present invention will be described in detail with reference to FIGS. 6 to 9.

Referring to FIGS. 6 to 9, a package body 10 in this embodiment supports a pair of lead frames, i.e., first and second lead frames 20 and 30. At this time, it is preferred that the package body 10 be molded out of a resin such that the package body 10 has an opening 12 in a side surface thereof and supports the first and second lead frames 20 and 30.

Similarly to the previous embodiment, the lead frames 20 and 30 include first and second inner leads 22 and 32, respectively, which are positioned within the opening 12 of the package body 10. At this time, the LED chip 2 is connected directly to the first inner lead 22 while the second inner lead 32 is connected indirectly to the LED chip 2. The term "indirect connection between the LED chip and the lead frame (or inner lead)" used herein means that the LED chip is electrically connected indirectly to the lead frame by means of, for example, a bonding wire without direct contact with the lead frame. Although not shown, the opening 12 is filled with an encapsulating material of epoxy resin so as to encapsulate the inner leads 22 and 32 and the LED chip 2 within the opening 12.

Meanwhile, the lead frames 20 and 30 include first and second lower legs (or first and second outer leads) 26 and 36 that extend from the first and second inner leads 22 and 32 to protrude at a lower portion of the package body 10. In this embodiment, the first and second lower legs 26 and 36 extend to the lower portion of the package body 10 through both left and right sides of the package body 10, respectively, and are then bent perpendicularly so as to have distal ends with horizontal electrical contact surfaces facing a surface of a substrate.

At this time, while the first and second lower legs 26 and 36 are positioned at both ends of the lower portion of the package body 10, the electrical contact surfaces provided at the respective lower legs 26 and 36 are electrically connected to the substrate (i.e., PCB or FPCB) by means of soldering.

In addition to the first and second lower legs 26 and 36, the side view type LED package 1 according to the present invention includes a heat dissipation protrusion 24 defining an additional heat dissipation path at the lower portion of the package body 10. The heat dissipation protrusion 24 protrudes from the first inner lead 22 of the first lead frame 20 with the LED chip 2 fixed directly thereto so as to pass through a lower surface of the package body 10.

The heat dissipation protrusion 24 assists in causing the heat generated from the LED chip 2 due to application of a high current to be outwardly dissipated along a shortest path, thereby greatly contributing to decreases in the junction temperature and thermal resistance of the LED chip 2. The heat dissipation protrusion 24 includes planar surfaces exposed outside the package body 10, i.e., heat dissipation surfaces. Designing the heat dissipation protrusion 24 by adjusting the areas of the planar surfaces of the heat dissipation protrusion in advance allows a desired heat dissipation efficiency to be obtained with respect to a current applied to the LED chip 2.

Further, the heat dissipation protrusion 24 is arranged at the lower portion of the package body 10 between the first lower leg 26 and the second lower leg 36. Since such an arrangement causes the heat dissipation protrusion 24 to be entirely shielded by the package body 10, the heat dissipation protrusion 24 does not increase an occupying space of the side view type LED package. Accordingly, the side view type LED package 1 of this embodiment can be appropriately used as a backlight for electronic equipment, such as a mobile phone, having a narrow space.

Referring to FIGS. 8 and 9, the first and second lower legs 26 and 36 of the side view type LED package 1 are soldered to electrodes (not shown) of the substrate 7 such as a PCB or FPCB to form electrical contacts. The heat dissipation protrusion 24 is positioned between the first lower leg 26 and the second lower leg 36 and outwardly dissipates heat from the lower portion of the package body 10.

As shown in FIG. 8, the heat dissipation protrusion 24 is arranged to be in contact with any other heat dissipation element 7a on the substrate 7, thereby more efficiently dissipating heat from the LED chip 2 due to a heat dissipation property of the heat dissipation element 7a. Alternatively, as shown in FIG. 9, the heat dissipation protrusion 24 may be in contact with external air over a larger contact area while being spaced apart from the substrate 7.

The aforementioned heat dissipation protrusion 24 has the same thickness as the first and second inner leads 22 and 32 and the first and second lower legs 26 and 36. This is because the heat dissipation protrusion 24 is a portion of the lead frame formed by cutting and bending a metal plate.

With the heat dissipation protrusion 24, the side view type LED package 1 according to the present invention has a heat dissipation path for outwardly dissipating the heat of the LED chip 2 along a shortest path. Securing such a heat dissipation path can suppress an increase in the junction temperature and also greatly decrease the thermal resistance of the side view type LED package 1 that increases as the junction temperature increases.

The side view type LED package according to the present invention is particularly suitable for an edge type backlight in which a light source is provided at a side edge of a light guide plate. However, the present invention is not limited thereto but may be usefully applied to electronic equipment requiring an illumination apparatus or light source.

The invention claimed is:

1. A side view type light emitting diode (LED) package including an LED chip, a package body having a side surface formed with an opening for receiving the LED chip, and lead frames for applying a current to the LED chip, wherein the lead frames comprise:
   inner leads electrically connected to the LED chip within the package body;
   electrical contact lower legs extending from the inner leads to a lower portion of the package body so as to be exposed outside the package body in the vicinity of a lower surface of the package body perpendicular to the side surface; and
   a heat dissipation means extending, separately from the electrical contact lower legs, from at least one of the inner leads outside the package body.

2. The side view type LED package as claimed in claim 1, wherein the heat dissipation means comprises at least one upper leg extending toward an upper portion of the package body so as to define a heat dissipation path in the vicinity of an upper surface of the package body.

3. The side view type LED package as claimed in claim 2, wherein the at least one upper leg comprises a plurality of upper legs, and at least one of the upper legs is formed integrally with one of the inner leads that is connected directly to the LED chip.

4. The side view type LED package as claimed in claim 2, wherein the lower legs and the at least one upper leg are bent to have horizontal surfaces at the upper and lower surfaces of the package body, respectively.

5. The side view type LED package as claimed in claim 1, wherein the electrical contact lower legs are a pair of electrical contact lower legs positioned at both ends of the package body while forming electrical contacts of different polarities, and the heat dissipation means has a heat dissipation lower leg positioned between the pair of electrical contact lower legs.

6. The side view type LED package as claimed in claim 3, wherein the upper legs and the lower legs including the electrical contact lower legs are formed to be symmetrical with each other at the upper and lower portions of the package body.

7. The side view type LED package as claimed in claim 6, wherein the upper and lower legs are positioned on the same planes as the upper and lower surfaces of the package body, respectively.

8. The side view type LED package as claimed in claim 1, wherein the heat dissipation means comprises a heat dissipation protrusion extending from one of the inner leads connected directly to the LED chip so as to protrude outside the lower surface of the package body.

9. The side view type LED package as claimed in claim 8, wherein the heat dissipation protrusion is positioned between the electrical contact lower legs.

10. The side view type LED package as claimed in claim 9, wherein the electrical contact lower legs have distal ends formed with electrical contact surfaces to be soldered to a substrate, and the heat dissipation protrusion positioned between the electrical contact lower legs is spaced apart from the substrate.

11. The side view type LED package as claimed in claim 9, wherein the electrical contact lower legs have distal ends formed with electrical contact surfaces to be soldered to a substrate, and the heat dissipation protrusion positioned between the electrical contact lower legs is in contact with an external heat dissipation element provided on the substrate.

12. The side view type LED package as claimed in claim 1, wherein the lead frames are formed by cutting and bending a metal plate so that the inner leads, the electrical contact lower legs and the heat dissipation means have an identical thickness.

* * * * *